(12) United States Patent
Hikichi et al.

(10) Patent No.: US 10,110,213 B2
(45) Date of Patent: Oct. 23, 2018

(54) SEMICONDUCTOR DEVICE

(71) Applicant: SII Semiconductor Corporation, Chiba-shi, Chiba (JP)

(72) Inventors: Tomoki Hikichi, Chiba (JP); Minoru Ariyama, Chiba (JP); Kozo Iijima, Chiba (JP); Masashi Shiga, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/685,508

(22) Filed: Aug. 24, 2017

(65) Prior Publication Data

US 2018/0062631 A1 Mar. 1, 2018

(30) Foreign Application Priority Data

Aug. 26, 2016 (JP) ................... 2016-165828
Jul. 12, 2017 (JP) ................... 2017-136328

(51) Int. Cl.
*H03K 5/24* (2006.01)
*G01R 19/00* (2006.01)
*G01R 19/165* (2006.01)

(52) U.S. Cl.
CPC ........... *H03K 5/24* (2013.01); *G01R 19/0092* (2013.01); *G01R 19/16566* (2013.01)

(58) Field of Classification Search
CPC ........ H03K 17/145; H03K 5/24; H03K 17/06; H03K 17/6871; H03K 2017/0806; H03K 5/14; G01R 19/0092; G01R 29/10; G01R 31/3277

USPC ................... 327/80, 108, 109, 110, 111, 112
See application file for complete search history.

(56) References Cited

U.S. PATENT DOCUMENTS

| | | | |
|---|---|---|---|
| 9,985,571 B2* | 5/2018 | Yamanaka | H02P 31/00 |
| 2009/0033324 A1* | 2/2009 | Tomida | G01R 33/07 |
| | | | 324/260 |
| 2017/0294772 A1* | 10/2017 | Illing | H02H 9/025 |

FOREIGN PATENT DOCUMENTS

JP 2009-031225 A 2/2009

* cited by examiner

*Primary Examiner* — John Poos
(74) *Attorney, Agent, or Firm* — Brinks Gilson & Lione

(57) ABSTRACT

Provided is a semiconductor device which is testable even with an inspection apparatus having low current drivability, and includes an output terminal which is also used as a test terminal and an output driver having high current drivability. The semiconductor device includes a plurality of voltage determination circuits connected to the output terminal of the semiconductor device, and have threshold values that are different from each other, an encoding circuit connected to the plurality of voltage determination circuits, and configured to output an encoded signal, and a mode switching circuit configured to output a mode signal to an internal circuit depending on the encoded signal and a signal from the internal circuit.

8 Claims, 3 Drawing Sheets

US 10,110,213 B2

SEMICONDUCTOR DEVICE

RELATED APPLICATIONS

This application claims priority under 35 U.S.C. § 119 to Japanese Patent Applications No. 2016-165828 filed on Aug. 26, 2016 and No. 2017-136328 filed on Jul. 12, 2017, the entire content of which are hereby incorporated by reference.

BACKGROUND OF THE INVENTION

1. Field of the Invention

The present invention relates to a semiconductor device, in particular, to a semiconductor device having an output terminal which includes an output driver having high drivability and which also operates as a test terminal.

2. Description of the Related Art

In a semiconductor device in which a dedicated test terminal cannot be provided due to a restriction on the number of terminals, there is mounted a circuit in which a test terminal for entering a test mode during inspection in mass production is used also as an output terminal.

In Japanese Patent Application Laid-open No. 2009-31225, for example, there is disclosed a technology of transition to a test mode by detecting an abnormal state that cannot occur in normal operation, and that occurs by a forceful voltage input from an output terminal.

However, the technology of Japanese Patent Application Laid-open No. 2009-31225 does not assume a combination of an inspection apparatus having low current drivability, and a semiconductor device in which the output terminal includes an output driver having high current drivability.

SUMMARY OF THE INVENTION

It is an object of the present invention to provide a semiconductor device, which is capable of being tested even with an inspection apparatus having low current drivability, and includes an output terminal, which is also used as a test terminal and includes an output driver having high current drivability.

A semiconductor device according to one embodiment of the present invention includes a plurality of voltage determination circuits, which are connected to an output terminal of the semiconductor device, and have threshold values that are different from each other, an encoding circuit, which is configured to output a binary encoded signal depending on signals input from the plurality of voltage determination circuits, and a mode switching circuit, which is configured to output a mode signal to an internal circuit depending on the binary encoded signal and a signal from the internal circuit, which are input to the mode switching circuit.

With the semiconductor device according to one embodiment of the present invention including the plurality of voltage determination circuits and the encoding circuit, even the inspection apparatus having the low current drivability can switch the internal circuit to a test mode by externally driving the output terminal including the output driver having the high current drivability.

DETAILED DESCRIPTION OF THE PREFERRED EMBODIMENTS

Now, a semiconductor device according to the present invention is described with reference to the drawings.

First Embodiment

Figure 1:
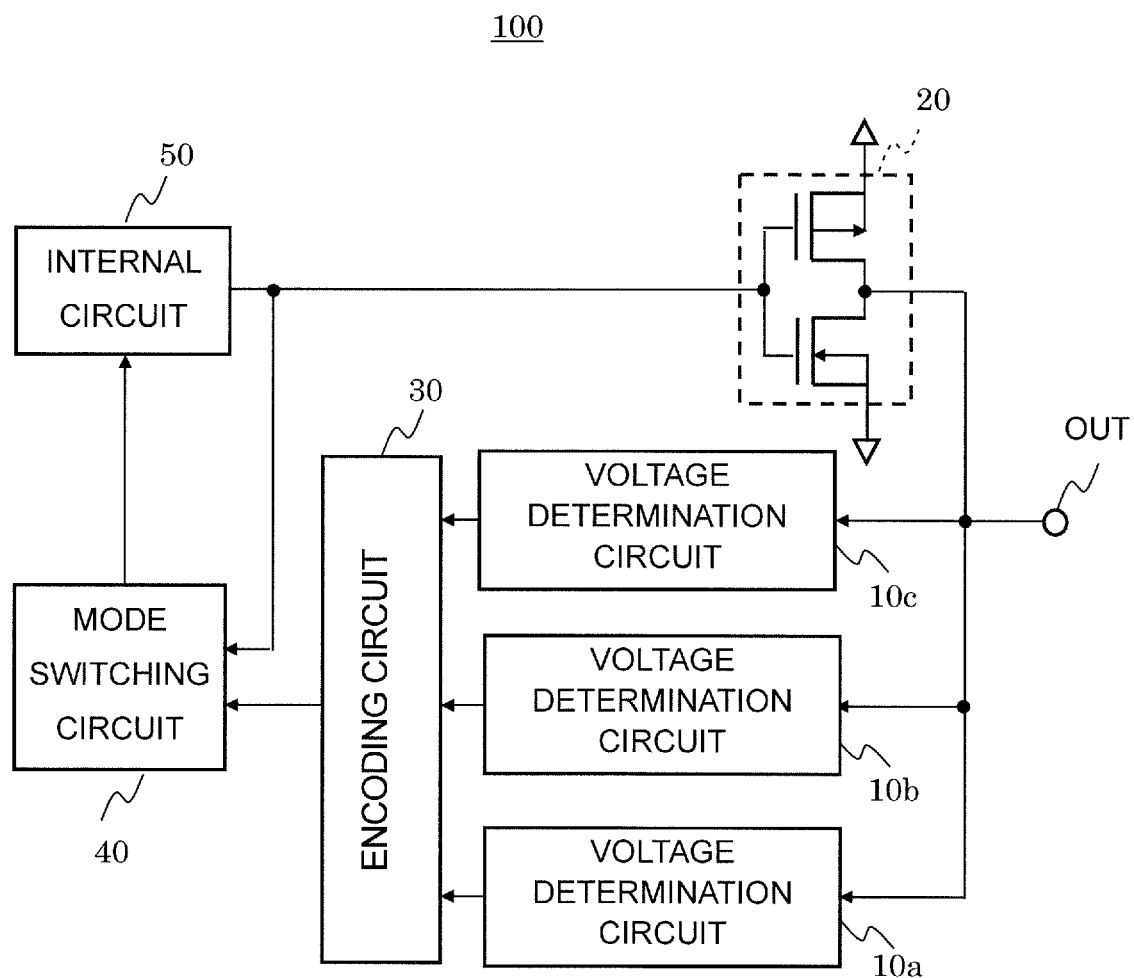
FIG. 1 is a block diagram of a semiconductor device according to a first embodiment of the present invention.

FIG. 1 is a block diagram of a semiconductor device 100 according to a first embodiment of the present invention.

The semiconductor device 100 according to the first embodiment includes voltage determination circuits 10a, 10b, and 10c, an output driver 20, an encoding circuit 30, a mode switching circuit 40, and an internal circuit 50.

The output driver 20 has an input connected to an output of the internal circuit 50, and an output connected to an output terminal OUT of the semiconductor device 100. The output terminal OUT is connected to inputs of the voltage determination circuits 10a, 10b, and 10c. The voltage determination circuits 10a, 10b, and 10c have outputs connected to inputs of the encoding circuit 30, respectively. The encoding circuit 30 has an output connected to a first input of the mode switching circuit 40. The mode switching circuit 40 has a second input connected to the output of the internal circuit 50, and an output connected to an input of the internal circuit 50.

The voltage determination circuit 10a has a threshold value Vt1, and outputs an output signal V10a. The output signal V10a from the voltage determination circuit 10a becomes an H level when a potential VOUT of the output terminal OUT is the threshold value Vt1 or more, and becomes an L level when the potential VOUT of the output terminal OUT is less than the threshold value Vt1.

The voltage determination circuit 10b has a threshold value Vt2, and outputs an output signal V10b. The output signal V10b from the voltage determination circuit 10b becomes an H level when the potential VOUT of the output terminal OUT is the threshold value Vt2 or more, and becomes an L level when the potential VOUT of the output terminal OUT is less than the threshold value Vt2.

The voltage determination circuit 10c has a threshold value Vt3, and outputs an output signal V10c. The output signal V10c from the voltage determination circuit 10c becomes an H level when the potential VOUT of the output terminal OUT is the threshold value Vt3 or more, and becomes an L level when the potential VOUT of the output terminal OUT is less than the threshold value Vt3.

Here, the threshold values Vt1 to Vt3 satisfy the relationship:

$$Vt1 < Vt2 < Vt3.$$

The encoding circuit 30, which is a binary logic circuit, receives as inputs the output signals from the voltage determination circuits 10a to 10c, and outputs a binary signal depending on the output signals. Here, when the output signal from the voltage determination circuit 10a is at the L level, the output signal from the voltage determination circuit 10b is at the L level, and the output signal from the voltage deter urination circuit 10c is at the L level, the output signals are expressed as LLL, for example. The binary signal output by the encoding circuit 30 is at an L level, an H level, the L level, and the H level when the output signals from the voltage determination circuits 10a to 10c are LLL, HLL, HHL, and HHH, respectively.

The mode switching circuit 40 receives as inputs an output potential of the internal circuit 50 and the binary signal from the encoding circuit 30, and when those signals have the same potential, outputs, to the internal circuit 50, a mode signal for switching the internal circuit 50 to a test mode.

In response to the mode signal input from the mode switching circuit 40, the internal circuit 50 outputs a result of determining a magnitude of a physical quantity when in a normal mode, for example, and executes a predetermined test operation when in the test mode.

The output driver 20 is a complementary metal-oxide-semiconductor (CMOS) output driver formed of a p-type MOS (PMOS) transistor and an n-type MOS (NMOS) transistor. Here, the output driver 20 has high current drivability.

Next, operation of the semiconductor device 100 according to the first embodiment is described.

First, there is described an operation in which, when the internal circuit 50 outputs an L-level signal, the potential VOUT of the output terminal OUT is forcefully set to an L level to put the internal circuit 50 in the test mode.

When the internal circuit 50 outputs the L-level signal, the PMOS transistor of the output driver 20 is turned on, and the potential VOUT of the output terminal OUT is at an H level.

At this time, when a source drive current is supplied to the output terminal OUT by an inspection apparatus having low current drivability, the potential VOUT of the output terminal OUT cannot be set to the L level because of a relationship between an ON resistance of the PMOS transistor of the output driver 20 and the current drivability of the inspection apparatus. Then, the potential VOUT becomes the threshold value Vt2 or more, and less than the threshold value Vt3.

With the potential VOUT of the output terminal OUT being the threshold value Vt1 or more, the voltage determination circuit 10a outputs the output signal V10a having the H level. With the potential VOUT of the output terminal OUT being the threshold value Vt2 or more, the voltage determination circuit 10b outputs the output signal V10b having the H level. With the potential VOUT of the output terminal OUT being less than the threshold value Vt3, the voltage determination circuit 10c outputs the output signal V10c having the L level. In other words, the encoding circuit 30 receives as inputs the HHL signals from the voltage determination circuits 10a to 10c.

When the HHL signals are input from the voltage determination circuits 10a to 10c, the encoding circuit 30 outputs the L-level signal. In other words, the encoding circuit 30 outputs the L-level signal as in the case where the potential VOUT is less than the threshold value Vt1.

When the internal circuit 50 outputs the L-level signal, and when the mode switching circuit 40 receives the L-level signal from the encoding circuit 30, the mode switching circuit 40 recognizes that the potential VOUT of the output terminal OUT is forcefully set to the L level, and outputs a mode signal for switching the internal circuit 50 to the test mode.

Next, there is described an operation in which, when the internal circuit 50 outputs an H-level signal, the potential VOUT of the output terminal OUT is forcefully set to the H level to put the internal circuit 50 in the test mode.

When the internal circuit 50 outputs the H-level signal, the NMOS transistor of the output driver 20 is turned on, and the potential VOUT of the output terminal OUT is at the L level.

At this time, when a sink drive current is supplied to the output terminal OUT by the inspection apparatus having the low current drivability, the potential VOUT of the output terminal OUT cannot be set to the H level because of a relationship between an ON resistance of the NMOS transistor of the output driver 20 and the current drivability of the inspection apparatus. Then, the potential VOUT becomes the threshold value Vt1 or more, and less than the threshold value Vt2.

With the potential VOUT of the output terminal OUT being the threshold value Vt1 or more, the voltage determination circuit 10a outputs the output signal V10a having the H level. With the potential VOUT of the output terminal OUT being less than the threshold value Vt2, the voltage determination circuit 10b outputs the output signal V10b having the L level. With the potential VOUT of the output terminal OUT being less than the threshold value Vt3, the voltage determination circuit 10c outputs the output signal V10c having the L level. In other words, the encoding circuit 30 receives as inputs the HLL signals from the voltage determination circuits 10a to 10c.

When the HLL signals are input from the voltage determination circuits 10a to 10c, the encoding circuit 30 outputs the H-level signal. In other words, the encoding circuit 30 outputs the H-level signal as in the case where the potential VOUT is the threshold value Vt3 or more.

When the internal circuit 50 outputs the H-level signal, and when the mode switching circuit 40 receives the H-level signal from the encoding circuit 30, the mode switching circuit 40 recognizes that the potential VOUT of the output terminal OUT is forcefully set to the H level, and outputs a mode signal for switching the internal circuit 50 to the test mode.

As described above, with the semiconductor device 100 according to the first embodiment, which includes the output driver 20 having the high current drivability, including the voltage determination circuits 10a to 10c and the encoding circuit 30, even the inspection apparatus having the low current drivability can put the internal circuit 50 in the test mode.

Second Embodiment

Figure 2:
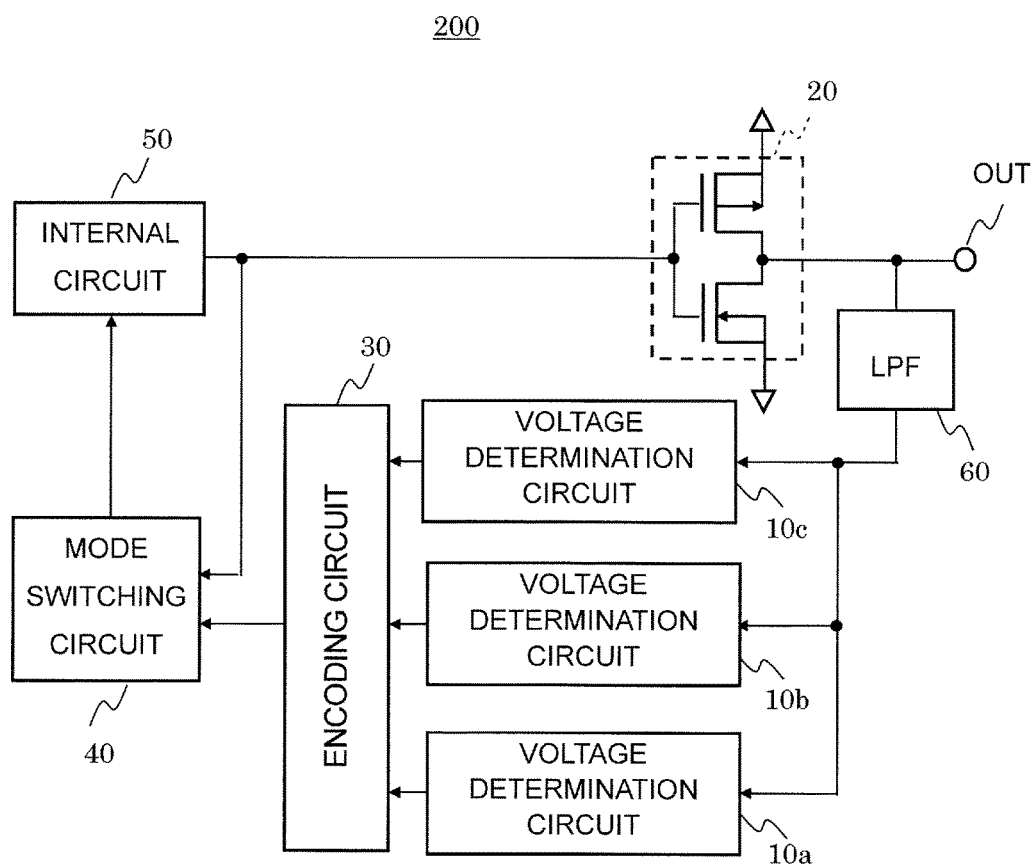
FIG. 2 is a block diagram of a semiconductor device according to a second embodiment of the present invention.

FIG. 2 is a block diagram of a semiconductor device 200 according to a second embodiment of the present invention. The semiconductor device 200 according to the second embodiment includes a low-pass filter 60 in addition to the semiconductor device 100 of FIG. 1. The remaining configuration is the same as that of the semiconductor device 100 of FIG. 1. The same components are denoted by the same reference symbols and description thereof is omitted.

The low-pass filter 60 is connected between the output terminal OUT and the voltage determination circuits 10a to 10c. The low-pass filter 60 has a function of preventing, when pulsed noise is superimposed on the output terminal OUT, the potential VOUT of the output terminal OUT, which is input to the voltage determination circuits 10a to 10c, from being fluctuated by the noise.

When the internal circuit 50 outputs the H-level signal, the NMOS transistor of the output driver 20 is turned on, and the potential VOUT of the output terminal OUT is at the L level. At this time, when pulsed H-level noise is superimposed on the output terminal OUT, the potential VOUT of the output terminal OUT becomes the threshold value Vt1 or more, and less than the threshold value Vt2 in a pulsed manner in relation to an ON resistance of the NMOS transistor of the output driver 20.

Even when the input potential VOUT fluctuates in the pulsed manner, the low-pass filter 60 responds in accordance with a certain time constant, and hence an output potential of the low-pass filter 60 does not exceed the threshold value Vt1.

In order to adapt to the inspection apparatus having the low current drivability, the semiconductor device 100 according to the first embodiment is configured to detect, with the low threshold value Vt1 of the voltage determination circuit 10*a*, the H level forcibly input to the output terminal OUT, and hence may be affected by the noise applied to the output terminal OUT. The semiconductor device 200 according to the second embodiment includes the low-pass filter 60 between the output terminal OUT and the voltage determination circuits 10*a* to 10*c*, and hence can eliminate the effect of the noise externally applied to the output terminal OUT.

As described above, the semiconductor device 200 according to the second embodiment has effects similar to those of the semiconductor device 100 according to the first embodiment, and further can eliminate the effect of the noise applied to the output terminal OUT, with the result that a more reliable semiconductor device can be provided.

Third Embodiment

Figure 3:
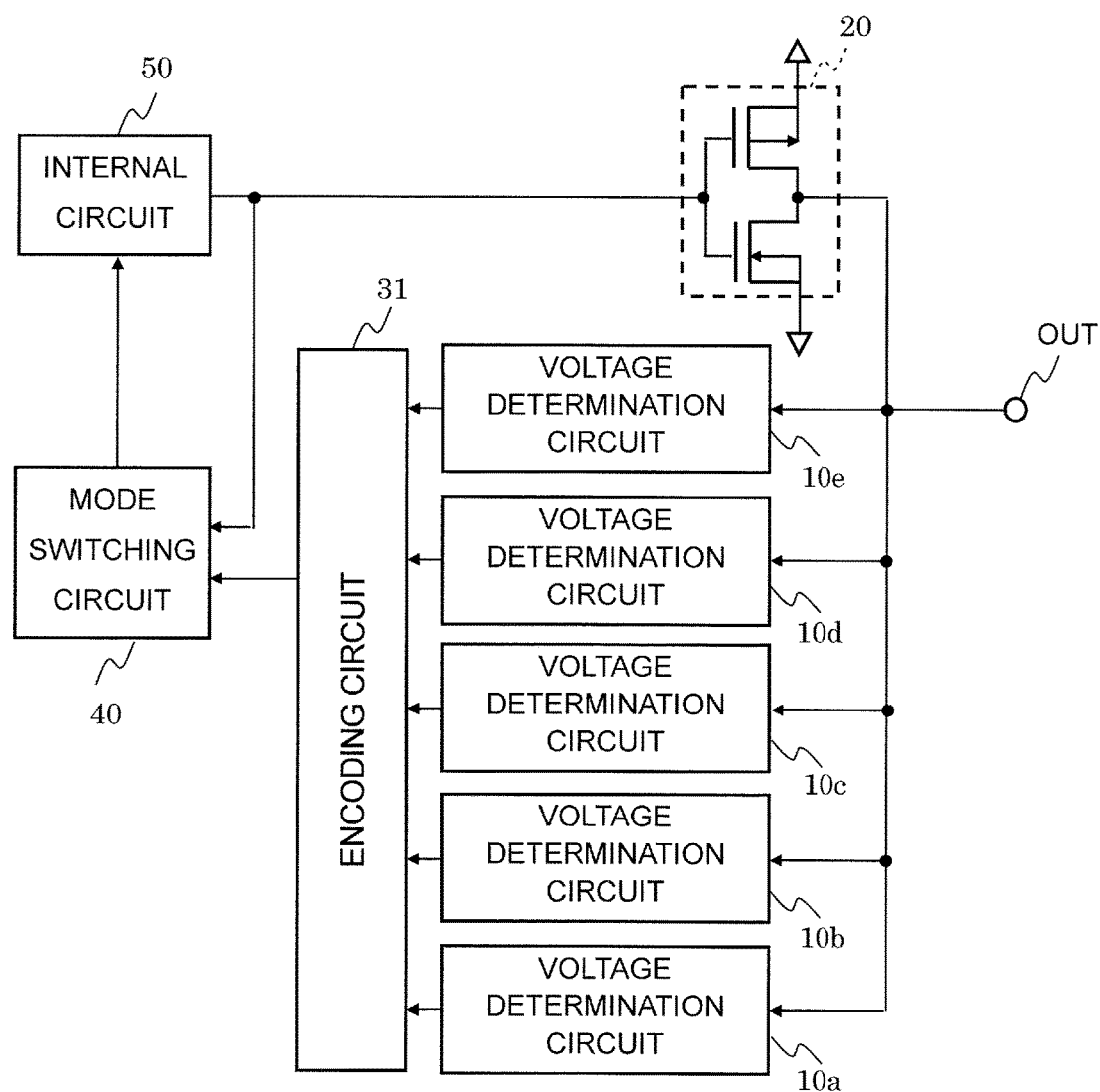
FIG. 3 is a block diagram of a semiconductor device according to a third embodiment of the present invention.

FIG. 3 is a block diagram of a semiconductor device 300 according to a third embodiment of the present invention. The semiconductor device 300 according to the third embodiment further includes voltage determination circuits 10*d* and 10*e*, and an encoding circuit 31 in addition to the semiconductor device 100 of FIG. 1. The remaining configuration is the same as that of the semiconductor device 100 of FIG. 1. The same components are denoted by the same reference symbols and description thereof is omitted.

The voltage determination circuit 10*d* has a threshold value Vt4, and outputs an output signal V10*d*. The output signal V10*d* from the voltage determination circuit 10*d* becomes an H level when the potential VOUT of the output terminal OUT is the threshold value Vt4 or more, and becomes an L level when the potential VOUT of the output terminal OUT is less than the threshold value Vt4.

The voltage determination circuit 10*e* has a threshold value Vt5, and outputs an output signal V10*e*. The output signal V10*e* from the voltage determination circuit 10*e* becomes an H level when the potential VOUT of the output terminal OUT is the threshold value Vt5 or more, and becomes an L level when the potential VOUT of the output terminal OUT is less than the threshold value Vt5.

Here, the threshold values Vt1 to Vt5 satisfy the relationship:

$$Vt1 < Vt2 < Vt3 < Vt4 < Vt5.$$

The encoding circuit 31, which is a binary logic circuit, receives as inputs the output signals from the voltage determination circuits 10*a* to 10*e*, and outputs a binary signal depending on the output signals. Here, the binary signal is at an L level, an H level, the L level, the H level, the L level, and the H level when the output signals from the voltage determination circuits 10*a* to 10*e* are LLLLL, HLLLL, HHLLL, HHHLL, HHHHL, and HHHHH, respectively.

Next, operation of the semiconductor device 300 according to the third embodiment is described.

First, there is described an operation in which, when the internal circuit 50 outputs an L-level signal, the potential VOUT of the output terminal OUT is forcefully set to the L level to put the internal circuit 50 in the test mode.

When the internal circuit 50 outputs the L-level signal, the PMOS transistor of the output driver 20 is turned on, and the potential VOUT of the output terminal OUT is at the H level.

When the source drive current is supplied to the output terminal OUT by the inspection apparatus having the low current drivability, the potential VOUT becomes the threshold value Vt4 or more, and less than the threshold value Vt5. When the HHHHL signals are input from the voltage determination circuits 10*a* to 10*e*, the encoding circuit 31 outputs the L-level signal.

Moreover, when the potential VOUT of the output terminal OUT becomes the threshold value Vt3 or more, and less than the threshold value Vt4, the HHHLL signals are input from the voltage determination circuits 10*a* to 10*e*, and hence the encoding circuit 31 outputs the H-level signal.

Accordingly, when the threshold value Vt4 and the threshold value Vt5 are set close to each other, in order to put the internal circuit 50 in the test mode, the potential VOUT of the output terminal OUT needs to be accurately set to the threshold value Vt4 or more, and less than the threshold value Vt5. In other words, the encoding circuit 31 has an effect that the semiconductor device 300 is less likely to be affected by the noise externally applied to the output terminal OUT.

Further, when the encoding circuit 31 is configured to sample the signals input from the voltage determination circuits 10*a* to 10*e* at appropriate intervals to output the binary signal, the semiconductor device 300 is much less likely to be affected by the noise.

In order to adapt to the inspection apparatus having the low current drivability, the semiconductor device 100 according to the first embodiment is configured to detect, with the low threshold value Vt1 of the voltage determination circuit 10*a*, the H level forcibly input to the output terminal OUT, and hence may be affected by the noise applied to the output terminal OUT. The semiconductor device 300 according to the third embodiment further includes the voltage determination circuits 10*d* and 10*e*, and hence can eliminate the effect of the noise externally applied to the output terminal OUT.

As described above, the semiconductor device 300 according to the third embodiment has effects similar to those of the semiconductor device 100 according to the first embodiment, and further can eliminate the effect of the noise applied to the output terminal OUT, with the result that a more reliable semiconductor device can be provided.

The embodiments of the present invention have been described above, but the present invention is not limited to the above-mentioned embodiments, and encompasses various modifications and combinations without departing from the gist of the present invention. For example, the semiconductor device according to the third embodiment may include a low-pass filter. Moreover, the example in which the CMOS driver is used as the output driver has been described, but the present invention is applicable to an output driver formed of any circuit. Further, there may be adopted a configuration in which the present invention is applied to a plurality of output terminals such that a test mode signal in a parallel form, which is formed of a plurality of bits, is supplied to the mode switching circuit.

What is claimed is:

1. A semiconductor device, comprising:
an output driver configured to output a signal input from an internal circuit to an output terminal;

a first voltage determination circuit connected to the output terminal, and having a first threshold value;

a second voltage determination circuit connected to the output terminal, and having a second threshold value higher than the first threshold value;

a third voltage determination circuit connected to the output terminal, and having a third threshold value higher than the second threshold value;

an encoding circuit connected to the first voltage determination circuit, the second voltage determination circuit, and the third voltage determination circuit, and configured to output a binary encoded signal depending on output signals from the first voltage determination circuit, the second voltage determination circuit, and the third voltage determination circuit; and a mode switching circuit connected to the encoding circuit, and configured to output a mode signal to the internal circuit depending on the binary encoded signal and the signal from the internal circuit which are input to the mode switching circuit.

2. A semiconductor device according to claim 1, wherein the encoding circuit is configured to:

output a first logic signal when a potential of the output terminal is lower than the first threshold value;

output a second logic signal when the potential of the output terminal is the first threshold value or more, and is lower than the second threshold value;

output the first logic signal when the potential of the output terminal is the second threshold value or more, and is lower than the third threshold value; and output the second logic signal when the potential of the output terminal is the third threshold value or more.

3. A semiconductor device according to claim 1, further comprising a low-pass filter provided between the output terminal and the first voltage determination circuit, the second voltage determination circuit, and the third voltage determination circuit.

4. A semiconductor device according to claim 2, further comprising a low-pass filter provided between the output terminal and the first voltage determination circuit, the second voltage determination circuit, and the third voltage determination circuit.

5. A semiconductor device, comprising:

an output driver configured to output a signal input from an internal circuit to an output terminal;

a first voltage determination circuit connected to the output terminal, and having a first threshold value;

a second voltage determination circuit connected to the output terminal, and having a second threshold value higher than the first threshold value;

a third voltage determination circuit connected to the output terminal of the semiconductor device, and having a third threshold value higher than the second threshold value;

a fourth voltage determination circuit connected to the output terminal of the semiconductor device, and having a fourth threshold value higher than the third threshold value;

a fifth voltage determination circuit connected to the output terminal of the semiconductor device, and having a fifth threshold value higher than the fourth threshold value;

an encoding circuit connected to the first voltage determination circuit, the second voltage determination circuit, the third voltage determination circuit, the fourth voltage determination circuit, and the fifth voltage determination circuit, and configured to output a binary encoded signal depending on output signals from the first voltage determination circuit, the second voltage determination circuit, the third voltage determination circuit, the fourth voltage determination circuit, and the fifth voltage determination circuit; and a mode switching circuit connected to the encoding circuit, and configured to output a mode signal to the internal circuit depending on the binary encoded signal and the signal from the internal circuit which are input to the mode switching circuit.

6. A semiconductor device according to claim 5, wherein the encoding circuit is configured to:

output a first logic signal when a potential of the output terminal is lower than the first threshold value;

output a second logic signal when the potential of the output terminal is the first threshold value or more, and is lower than the second threshold value;

output the first logic signal when the potential of the output terminal is the second threshold value or more, and is lower than the third threshold value;

output the second logic signal when the potential of the output terminal is the third threshold value or more, and is lower than the fourth threshold value;

output the first logic signal when the potential of the output terminal is the fourth threshold value or more, and is lower than the fifth threshold value; and output the second logic signal when the potential of the output terminal is the fifth threshold value or more.

7. A semiconductor device according to claim 5, further comprising a low-pass filter provided between the output terminal and the first voltage determination circuit, the second voltage determination circuit, the third voltage determination circuit, the fourth voltage determination circuit, and the fifth voltage determination circuit.

8. A semiconductor device according to claim 6, further comprising a low-pass filter provided between the output terminal and the first voltage determination circuit, the second voltage determination circuit, the third voltage determination circuit, the fourth voltage determination circuit, and the fifth voltage determination circuit.

* * * * *